United States Patent [19]
Abe

[11] Patent Number: 5,993,901
[45] Date of Patent: Nov. 30, 1999

[54] PRODUCTION OF THIN FILMS OF A LEAD TITANATE SYSTEM

[75] Inventor: Yoshio Abe, Kyoto, Japan

[73] Assignee: Murata Manufacturing Co., Ltd., Japan

[21] Appl. No.: 08/184,675

[22] Filed: Jan. 21, 1994

[30] Foreign Application Priority Data

Jan. 20, 1993 [JP] Japan .................................. 5-007430
Jan. 20, 1993 [JP] Japan .................................. 5-007431

[51] Int. Cl.$^6$ .............................. B05D 3/02; B05D 1/18
[52] U.S. Cl. ................... 427/226; 427/126.3; 427/430.1
[58] Field of Search ................................ 427/226, 126.3, 427/430.1, 443.2

[56] References Cited

U.S. PATENT DOCUMENTS

| | | | |
|---|---|---|---|
| 4,485,094 | 11/1984 | Pebler et al. | 427/126.3 |
| 4,668,299 | 5/1987 | Nanao et al. | 106/309 |
| 4,920,093 | 4/1990 | Nonaka et al. | 427/226 |
| 5,028,455 | 7/1991 | Miller et al. | 427/126.3 |
| 5,072,035 | 12/1991 | Chen et al. | 252/62.9 |
| 5,198,269 | 3/1993 | Swartz et al. | 427/226 |

FOREIGN PATENT DOCUMENTS

| | | |
|---|---|---|
| 60-84712 | 5/1985 | Japan . |
| 62-41311 | 9/1987 | Japan . |
| 63-178408 | 7/1988 | Japan . |
| 64-6306 | 1/1989 | Japan . |
| 64-74778 | 3/1989 | Japan . |
| 1-222046 | 9/1989 | Japan . |
| 1-260870 | 10/1989 | Japan . |
| 2-57686 | 2/1990 | Japan . |
| 3-283583 | 12/1991 | Japan . |

OTHER PUBLICATIONS

Vest et al, "Synthesis of metal–organic compounds for MOD Powders and Films", MRS (Boston, MA) Dec. 1985 pp. 1–10.
Journal of Materials Science, vol. 25, No. 9, Sep. 1990, "Dip Coating Of PT, PZ And PZT Films Using An Alkoxide–Diethanolamine Method", Y. Takahashi et al., pp. 3960–3964.
Journal of Materials Science, vol. 20, No. 12, Dec. 1985, "Sol–gel–derived PbTiO3", J.B. Blum et al., pp. 4479–4483.
Patent Abstracts of Japan, vol. 014, No. 131 Mar. 13, 1990, JP–A–02 006 335 (Toray Ind Inc) Jan. 10, 1990.
"Production of PZT Thin Films by Hydrothermal Synthesis", K. Shimomura et al., (1991) Proceeding papers For Lectures, The Eighth Meeting On Applications of Ferroelectrics, pp. 88–89, May 1991.

*Primary Examiner*—Roy V. King
*Attorney, Agent, or Firm*—Ostrolenk, Faber, Gerb & Soffen, LLP

[57] ABSTRACT

Thin films of the lead titanate system expressed by the general formula: $Pb(Zr_xTi_{1-x})O_3$, where $0 \leq x < 1$, are produced by (a) preparing a complex alkoxide including at least lead and titanium atoms by a liquid-phase reaction of lead carboxylate with at least one alkoxide of titanium and zirconium alkoxides, (b) dissolving the resultant complex alkoxide in water to prepare an aqueous solution of the complex alkoxide, and (c) immersing a substrate in the resultant aqueous solution to deposit a thin film of the lead titanate system on said substrate by hydrolysis of the complex alkoxide. The resultant thin film may heated to a temperature ranging from 400 to 900° C. to produce thin films with a perovskite structure.

18 Claims, 2 Drawing Sheets

PRODUCTION OF THIN FILMS OF A LEAD TITANATE SYSTEM

BACKGROUND OF THE INVENTION

1. Field of the Invention

The present invention relates to a production of thin films of a lead titanate system and, more particularly, a process of producing thin films of a lead titanate system useful as a material for electronic parts.

2. Description of the Prior Art

A ceramic material of a lead titanate system, expressed by the general formula: $Pb(Zr_xTi_{1-x})O_3$, where $0 \leq x < 1$, possesses good properties required for a ferroelectric material, a piezoelectric material, or a pyroelectric material and has widely been used for various electronic parts such as, for example, ceramic capacitors, actuators and pyroelectric infrared sensors. With increasing demands for miniaturization and high performance of electronic equipments, it is common to use such a ceramic material of a lead titanate system in the form of thin film. To this end, there have been proposed various processes of producing thin films of ceramics, such as sputtering (JP-B-62-41311, JP-B-63-238799), chemical vapor deposition (CVD, JP-A-63-178408), vacuum evaporation (JP-A-1-6306, JP-A-1-74778), cluster ion-beam process (JP-A-1-222046), plasma process (JP-A-2-57686), coating (JP-A-3-283583), fusion process (JP-A-60-84712), a sol-gel method (JP-A-26087), and hydrothermal synthesis (Proceeding papers, pp. 88–89, The eighth meetings of application of ferroelectrics). These processes may be divided into two groups, i.e., a vapor phase process in which the fabrication of thin films is carried out in a vapor phase, and a liquid phase process in which the fabrication of thin films is carried out in a liquid phase.

However, these processes have various problems awaiting a solution. For example, the vapor phase process (i.e., sputtering, chemical vapor deposition and vacuum evaporation, cluster ion-beam process, plasma process) requires use of complex and expensive equipment, resulting in considerable increase of production cost of the thin films. Further, the fabrication of the thin films is carried out in a gas stream of the raw materials, thus making is impossible to form thin films on the whole surface of the substrates, especially back of the substrate or on substrates with the complex configuration. In addition, there is a limit to the material of the substrates as the film fabrication is carried out at a high temperature.

On the other hand, in the liquid phase process, for example, the coating is too troublesome to operate as it requires coating and baking operations repeatedly. In addition, the coating process cannot be applied to substrates of a complex configuration. The sol-gel method has the disadvantage that it is inevitable to produce cracking in the thin film during firing. If the substrate has a many-tiered surface, it is difficult to produce uniform thin films. The hydrothermal method requires use of a substrate made of metallic titanium or coated with metallic titanium, thus making it difficult to increase applications thereof. In the fusion process in which a substrate with a fused solution is subjected to rapid cooling, there is a limit to the material of the substrates as the substrate is required to have a high heat resistance.

SUMMARY OF THE INVENTION

It is therefore a main object of the present invention to produce thin films of a lead titanate system having a large surface area at a low cost without limit to a shape or kind of substrates.

Another object of the present invention is to provide a process of producing thin films of a lead titanate system having a desired composition with ease at a low cost.

The above and other objects of the present invention are achieved by providing a process of producing thin films of a lead titanate system expressed by the general formula: $Pb(Zr_xTi_{1-x})O_3$, where $0 \leq x < 1$, preferably, $0 \leq x \leq 0.95$, said process comprising the step of: (a) preparing a complex alkoxide including at least lead and titanium atoms by a liquid-phase reaction of lead carboxylate with at least one alkoxide of titanium and zirconium, (b) dissolving the resultant complex alkoxide in water to prepare an aqueous solution of the complex alkoxide, and (c) immersing a substrate in the resultant aqueous solution to deposit a thin film of the lead titanate system on said substrate by hydrolysis of said complex alkoxide.

The resultant thin films may be heat-treated to produce thin films with a perovskite structure.

In a preferred embodiment, the liquid phase reaction is carried out by dissolving lead carboxylate in ethylene glycol monoalkyl ether, dehydrating the resultant lead carboxylate solution, mixing it with titanium alkoxide, and heating the resultant mixture at a temperature higher than a boiling point of the mixture to prepare a complex alkoxide of lead and titanium.

In another preferred embodiment, the liquid phase reaction is carried out by dissolving lead carboxylate in ethylene glycol monoalkyl ether, dehydrating the resultant lead carboxylate solution, mixing it with titanium alkoxide and zirconium alkoxide, and heating the resultant mixture at a temperature higher than the boiling point of the mixture to prepare a complex alkoxide of lead, zirconium and titanium.

As the lead carboxylate, it is preferred to use salts of carboxylic acids having less than or equal to 10 carbon atoms, preferably, less than or equal to 6 carbon atoms. Typical lead carboxylates are those such as lead acetate, lead propionate, lead butyrate, lead caprate, and lead caprylate. Lead carboxylate may be added to an alkoxide solution containing titanium alkoxide and zirconium alkoxide as it is or as a solution dissolved in the same solvent as that used for preparation of the alkoxide solution.

As the titanium alkoxide and zirconium alkoxide, it is preferred to use an alkoxide including an alkoxyl group having less than or equal to 15 carbon atoms, preferably, less than or equal to 8 carbon atoms, or an alkanolamine derivative thereof, i.e., titanium or zirconium alkoxide modified by one or more alkanolamines expressed by the general formula: $HO(C_nH_{2n})_mNH_{3-m}$ where n is an integer less than or equal to 10, and m is an integer of 1, 2 or 3. The alkanolamines includes, without being limited to, ethanolamine, propanolamines, butanolamines, etc.

Typical alkoxides, for example, titanium alkoxides include, without being limited to, tetraethyl titanate $Ti(OC_2H_5)_4$, tetrabutyl titanate $Ti(OC_4H_9)_4$, tetraisopropyl titanate $Ti(OC_3H_7)_4$, dibutoxy di(triethoxy) amino titanate $Ti(OC_4H_9)_2\{(OC_2H_5)_3N\}_2$, dibutoxy di(2-hydroxy-ethylamino)-ethoxy titanate $Ti(OC_4H_9)_2 \cdot [N(C_2H_4OH)_2 \cdot (C_2H_4O)_2]$, etc. Typical zirconium alkoxides include, without being limited to, tetraethyl zirconate, tetrabutyl zirconate, tetraisopropyl zirconate, dibutoxy-di(triethoxy)-amino zirconate, dibutoxy-di(2-(hydroxy-ethylamino)-ethoxy) zirconate, etc.

The complex alkoxide may be modified by one or more alkanolamines expressed by the general formula: $HO(C_nH_{2n})_mNH_{3-m}$ where n is an integer less than or equal to 10, and m is an integer of 1, 2 or 3. In particular, it is preferred to use ethanolamine. Further, the reaction mixture resulting from the liquid-phase reaction may be diluted with water instead of dissolution of the complex oxide in water.

As the solvent for the liquid phase reactions, it is preferred to use ethylene glycol monoalkyl or monoaryl ether having an alcoholic hydroxyl group and an ether linkage, which may be expressed by the general formula: $ROCOOCH_2OCH_3$ where R is an alkyl group having carbon atoms less than or equal to 10 or an aryl group. Typical ethylene monoalkyl ether includes, without being limited to, ethylene glycol monomethyl ether, ethylene glycol monoethyl ether, ethylene glycol monoisopropyl ether, ethylene glycol mono-n-butyl ether, and commercially available products such as methyl Cellosolve (Trade name for ethylene glycol monomethyl ether, of Union Carbide Corporation), Cellosolve solvent (Trade name for ethylene glycol monoethyl ether, of Union Carbide Corporation). Typical ethylene monoaryl ether includes, without being limited to, ethylene glycol monophenyl ether, ethylene glycol monotolyl ether, and the like.

In the process according to the present invention, a complex alkoxide is formed first by allowing lead carboxylate to react with titanium alkoxide, or titanium alkoxide and zirconium alkoxide in a suitable solvent, for example, ethylene glycol monomethyl ether. The resultant complex alkoxide is then dissolved in water to prepare an aqueous solution of complex alkoxide. Then, a substrate is immersed in the aqueous solution of the complex alkoxide, whereby the hydrolysis of the complex oxide takes place little by little. With the progress of hydrolysis, heterogeneous nucleation and nuclear growth take place on the entire substrate surface to form a thin film. The resultant thin film is then treated with heat to form a thin film of lead titanate or lead zirconate titanate having a perovskite structure.

Accordingly, the present invention makes it possible to form homogeneous thin films of the lead titanate system on any desired substrate of a large area with ease at a moderate cost. Further, the thermal treatment can be carried out at a low temperature ranging from 400 to 900° C. and thus lead in the deposit can be prevented from evaporation, which in turn makes it possible to produce thin films of a lead titanate system having a desired composition without causing deviation of molar ratios due to evaporation of lead.

Preferably, the aqueous solution has the lead ion concentration ranging from 0.01 mM/l to 100 mM/l in terms of $Pb^{2+}$ and the titanium ion concentration ranging from 0.01 mM/l to 100 mM/l in terms of $Ti^{4+}$. In case of the production of lead zirconate titanate, it is preferred to use an aqueous solution having the lead ion concentration ranging from 0.01 mM/l to 100 mM/l in terms of $Pb^{2+}$ and the combined concentration of zirconium and titanium ions ranging from 0.01 mM/l to 100 mM/l in terms of $Ti^{4+}$ and $Zr^4$, respectively. If the lead ion concentration, titanium ion concentration, or the combined concentration of zirconium and titanium ions is less than 0.01 mM/l in terms of $Pb^{2+}$, $Ti^{4+}$ and $Zr^4$, respectively, they deposit in spots on the substrate and provide no uniform lead zirconate titanate thin films. If the lead ion concentration, titanium ion concentration, or the combined concentration of zirconium and titanium ions exceeds 100 mM/l in terms of $Pb^{2+}$, $Ti^{4+}$ and $Zr^4$, respectively, no heterogeneous nucleation takes place on the substrate and they nucleate homogeneously, resulting in precipitation of lead zirconate titanate in the solution.

The aqueous solution is preferably maintained at a temperature ranging from 0 to 110° C. during film deposition. If the temperature of aqueous solution is less than 0° C., the deposition rate becomes considerably lowered, thus making it difficult to produce thin films of lead zirconate titanate. If the temperature of aqueous solution exceeds 110° C., bubbles form in the solution, resulting in decrease in continuity, smoothness and homogeneousness of the film.

The thermal treatment of the deposited film is preferably carried out at a temperature ranging from 400 to 900° C. If the temperature is less than 400° C., it can provide a thin film having an amorphous structure or a pyrochlore structure, thus making it impossible to produce ferroelectric thin films of lead zirconate titanate with a perovskite structure. If the temperature exceeds 900° C., acicular crystal growth of lead titanate becomes takes place, resulting in lowering of the smoothness and homogeneousness of the thin film. In case of production of lead titanate thin films, however, it is preferred to treat the deposited film at a temperature ranging from 400 to 750° C. If the temperature is less than 400° C., it produces lead titanate of an amorphous phase or a pyrochlore phase, thus making it impossible to produce ferroelectric thin films of lead zirconate titanate with a perovskite structure. If the temperature exceeds 750° C., acicular crystal growth of lead titanate becomes takes place, resulting in lowering of the smoothness and homogeneousness of the thin film.

As a material for the substrate, there may be used any substrates of conventionally used for the like purposes, such as ceramics, glass, metal oxides, and the like.

The present invention will become apparent from the following description with reference to the preferred examples thereof.

EXAMPLE 1

Lead acetate (0.5 mol) was dissolved in 4 moles of methyl Cellosolve (Tradename for ethylene glycol monomethyl ether, of Union Carbide Corporation) and the resultant lead acetate solution was heated to about 110° C. to remove the water by evaporation. The dehydrated lead acetate solution was cooled to about 50° C. and mixed with tetraisopropyl titanate in the molar ratios shown in Table 1. The resultant mixture was heated to about 100° C. and kept at that temperature for 1 hour to prepare a complex alkoxide.

Added to the reaction solution was 2 moles of triethanolamine to replace alkoxyl group with aminotriethoxy group, whereby a triethanolamine-modified lead titanium complex alkoxide was obtained. The complex alkoxide was dissolved in ion-exchanged distilled water to prepare an aqueous solution of complex alkoxide having the ion concentrations shown in Table 1. Mirror-polished substrates of sintered alumina having a size of 10 mm×15 mm×2 mm were immersed in the resultant aqueous solutions maintained at the temperature of Table 1, and allowed to stand for 4 days at that temperature to deposit a thin film on the substrate. Each substrate was then taken out of the solution and thermally treated in air at a temperature of Table 1 for 1 hour to form a lead titanate thin film.

TABLE 1

| No. | $Pb^{2+}$ (Mm/l) | Temp. of Solution (° C.) | Temp. of Heating (° C.) |
|---|---|---|---|
| *1 | 0.005 | 110 | 500 |
| *2 | 100 | 115 | 500 |
| 3 | 0.01 | 110 | 400 |
| 4 | 0.1 | 100 | 500 |
| 5 | 1 | 40 | 600 |
| 6 | 10 | 5 | 700 |
| 7 | 100 | 0 | 750 |

Figure 1:
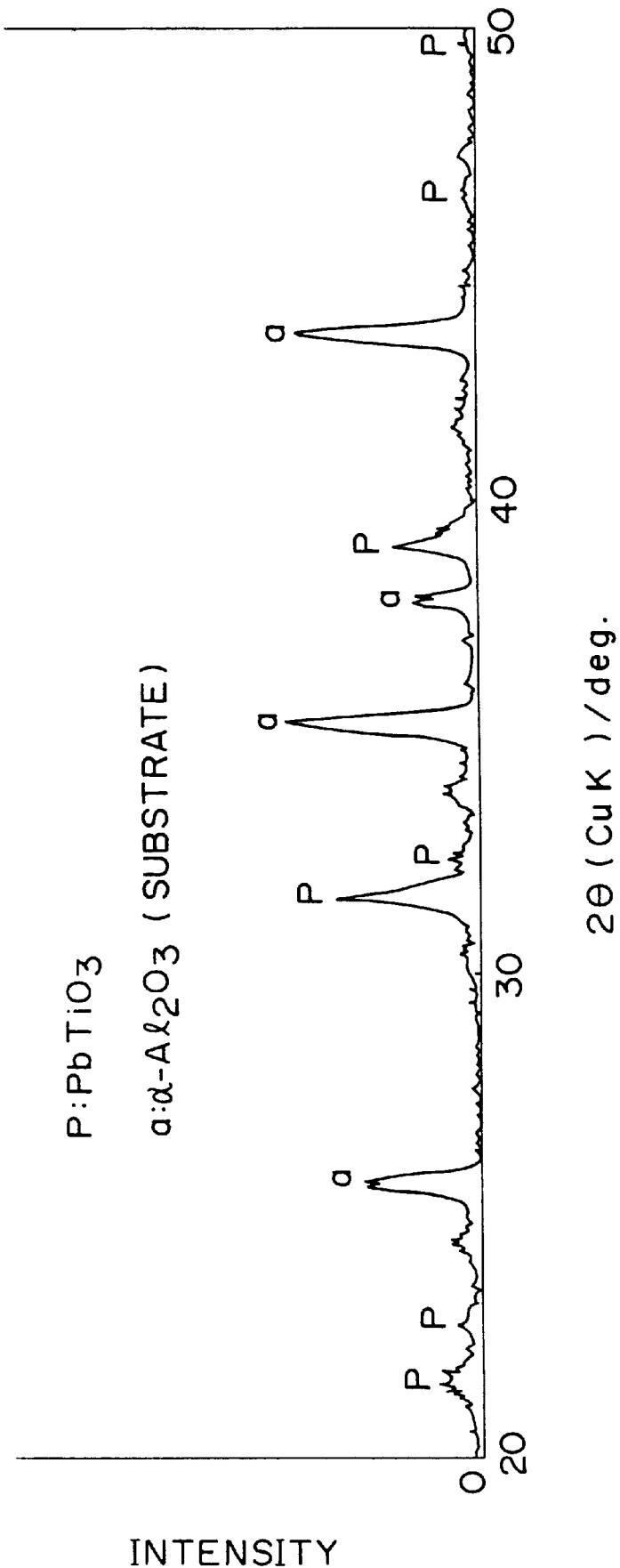
FIG. 1 is a X-ray diffraction chart for a thin film of lead titanate produced by the process according to the present invention.

For the specimens Nos. 3 to 7, it was observed that a uniform thin film is deposited on the substrate surface. The X-ray diffraction patterns showed these thin films to be a single phase of lead titanate of a perovskite structure. The X-ray diffraction patterns for specimen No. 6 is shown in FIG. 1. For specimens Nos. 1 and 2, there were obtained no uniform thin film of lead titanate. This results from the facts that the aqueous solution of complex alkoxide for specimen No. 1 is low in the lead ion concentration, and that the aqueous solution of complex alkoxide for specimen No. 2 is high in the lead ion concentration.

EXAMPLE 2

Lead acetate (0.1 mol) was dissolved in 0.8 mol of ethylene glycol monomethyl ether and the resultant lead acetate solution was heated to and maintained at about 110° C. to remove the water by evaporation, and then cooled to about 50° C. Then, tetraisopropyl titanate and tetraisopropyl zirconate were added to the dehydrated lead acetate solution in molar ratios shown in Table 2 and the mixture was heated to and kept at about 100° C. for 24 hours to prepare a complex alkoxide.

The resultant reaction mixture was dissolved in 30 ml of ion-exchanged distilled water to prepare an aqueous solution of complex alkoxide having the ion concentrations shown in Table 2. Mirror-polished substrates of sintered alumina having a size of 10 mm×15 mm×2 mm were immersed in the resultant aqueous solution maintained at the temperature shown in Table 2, and then allowed to stand for 4 days at that temperature to deposit a thin film on the substrate. Each substrate was then taken out of the solution, heated to the temperature shown in Table 2, and kept at that temperature for 1 hour to form a lead zirconate titanate thin film, and then cooled to room temperature.

TABLE 2

| No. | $Pb^{2+}$ (mM/l) | $Ti^{4+}$ (mM/l) | $Zr^{4+}$ (mM/l) | Pb:Ti:Zr (Mol) | Temp. of Solution (° C.) | Temp. of Heating (° C.) |
|---|---|---|---|---|---|---|
| *1 | 0.005 | 0.0025 | 0.0025 | 1:0.5:0.5 | 110 | 500 |
| *2 | 100 | 10 | 90 | 1:0.1:0.9 | 115 | 500 |
| 3 | 0.01 | 0.048 | 0.052 | 1:0.48:0.52 | 110 | 400 |
| 4 | 0.1 | 0.05 | 0.095 | 1:0.05:0.95 | 100 | 500 |
| 5 | 1 | 0.7 | 0.3 | 1:0.7:0.3 | 40 | 700 |
| 6 | 10 | 5 | 5 | 1:0.5:0.5 | 5 | 800 |
| 7 | 100 | 40 | 60 | 1:0.4:0.6 | 0 | 900 |

Figure 2:
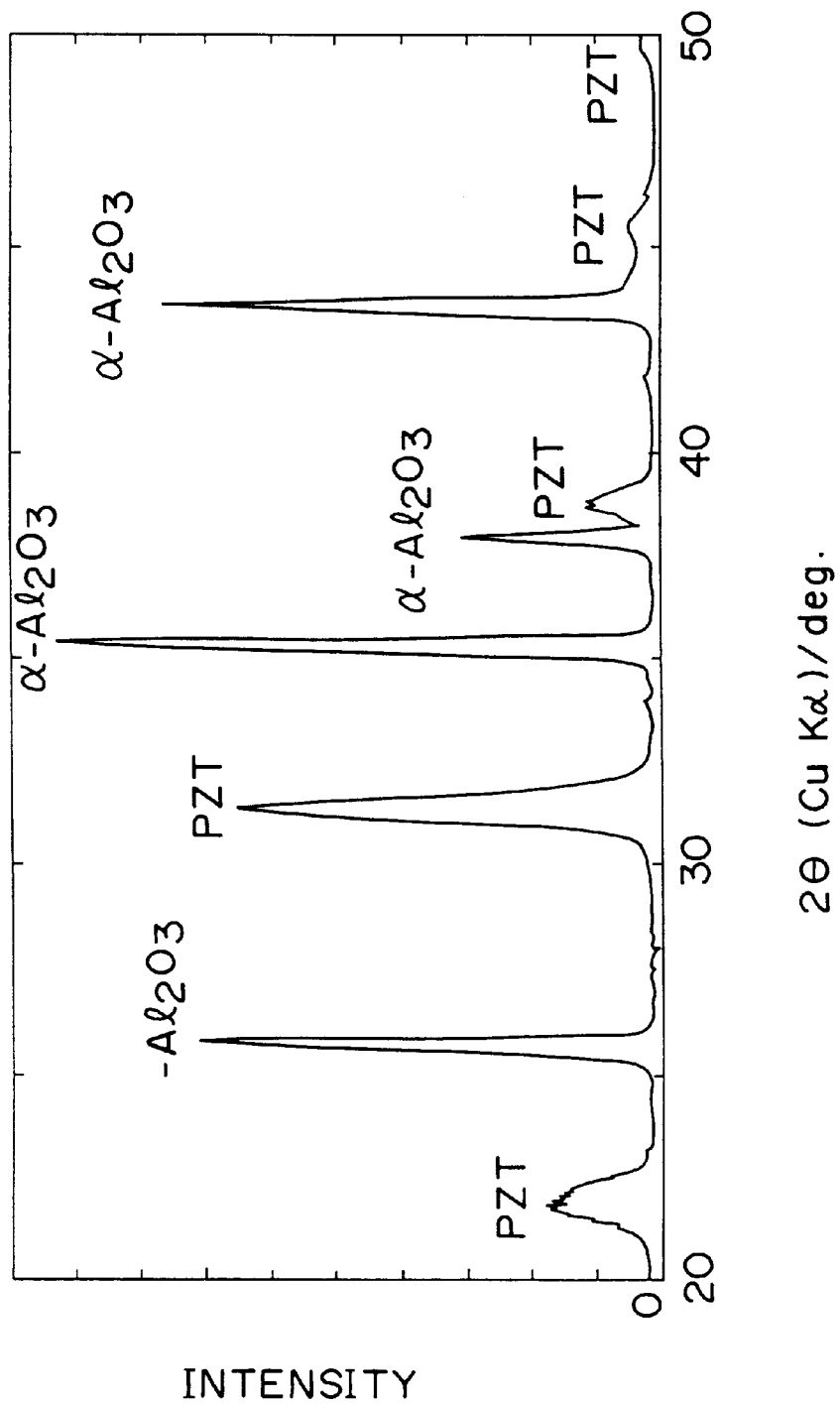
FIG. 2 is a X-ray diffraction chart for a thin film of lead zirconate titanate produced by the process according to the present invention.

For the specimens excluding specimens Nos. 1 and 2, it was observed that a uniform thin film is deposited on the substrate surface. The X-ray diffraction patterns showed these thin films to be a single phase of lead zirconate titanate with the perovskite structure. The X-ray diffraction patterns for specimen No. 5 is shown in FIG. 2. For specimens Nos. 1 and 2, no film was observed on the substrate surface. This results from the facts that the aqueous solution of complex alkoxide for specimen No. 1 is low in the lead ion concentration and the combined concentration of zirconium and titanium ions, and that the aqueous solution of complex alkoxide for specimen No. 2 is high in the lead ion concentration and the combined concentration of zirconium and titanium ions.

Further, since the thin films can be directly deposited on the substrate surface, it is possible to select a material and configuration of substrates from wide ranges, which in turn makes it possible to expand the area of applications of thin films of a lead titanate system.

Although the present invention has been fully described in connection with the preferred examples, it is to be noted that various changes and modifications, which are apparent to those skilled in the art, are to be understood as included within the scope of the present invention as defined by the appended claims unless they depart therefrom.

What is claimed is:

1. A process of producing thin films of a lead titanate system expressed by the general formula: $Pb(Zr_xTi_{1-x})O_3$, where $0 \leq x < 1$, said process comprising the step of: (a) preparing a complex alkoxide including at least lead and titanium atoms by a liquid-phase reaction of lead carboxylate with titanium alkoxide and optionally also zirconium alkoxide, (b) dissolving the resultant complex alkoxide in water to prepare an aqueous solution of the complex alkoxide, and (c) immersing a substrate in the resultant aqueous solution to deposit a thin film of the lead titanate system on said substrate by hydrolysis of said complex alkoxide.

2. The process according to claim 1 further including the step of heat-treating said thin film of the lead titanate system to produce a thin film with a perovskite structure.

3. The process according to claim 1 wherein said liquid phase reaction is carried out by dissolving lead carboxylate in ethylene glycol monoalkyl ether, dehydrating the resultant lead carboxylate solution, mixing it with titanium alkoxide, and heating the resultant mixture at a temperature higher than a boiling point of the mixture to prepare a complex alkoxide of lead and titanium.

4. The process according to claim 1 wherein said liquid phase reaction is carried out by dissolving lead carboxylate in ethylene glycol monoalkyl ether, dehydrating the resultant lead carboxylate solution, mixing it with titanium alkoxide and zirconium alkoxide, and heating the resultant mixture at a temperature higher than a boiling point of the mixture to prepare a complex alkoxide of lead, zirconium and titanium.

5. The process according to claim 1 wherein the reaction solution containing the complex alkoxide is combined with alkanolamine before dissolving it in water.

6. The process according to claim 1 wherein dissolution of the complex oxide is carried out by diluting the reaction mixture resulting from the liquid-phase reaction with water.

7. The process according to claim 1 wherein lead carboxylate is a salt of a carboxylic acid having carbon atoms less than or equal to 10.

8. The process according to claim 7 wherein said lead carboxylate is selected from the group consisting of lead acetate, lead propionate, lead butyrate, lead caprate, and lead caprylate.

9. The process according to claim 1 wherein said titanium alkoxide is an alkoxide including an alkoxyl group having carbon atoms less than or equal to 15.

10. The process according to claim 1 wherein said titanium alkoxide is selected from the group consisting of tetraethyl titanate, tetrabutyl titanate, tetraisopropyl titanate, dibutoxy di(triethoxy) amino titanate, dibutoxy di(2-hydroxy-ethylamino)-ethoxy titanate.

11. The process according to claim 1 wherein said zirconium alkoxide is selected from the group consisting of tetraethyl zirconate, tetrabutyl zirconate, tetraisopropyl zirconate, dibutoxy-di(triethoxy)-amino zirconate, dibutoxy-di(2-(hydroxy-ethylamino)-ethoxy) zirconate.

12. The process according to claim 1 wherein said titanium alkoxide is an alkanolamine derivative modified by one or more alkanolamines expressed by the general formula: $HO(C_nH_{2n})_mNH_{3-m}$ where n is an integer less than or equal to 10, and m is an integer of 1, 2 or 3.

13. The process according to claim 1 wherein said liquid phase reaction is carried out in a solvent of ethylene glycol monoalkyl or monoaryl ether.

14. The process according to claim 1 wherein said aqueous solution has a lead ion concentration ranging from 0.01 mM/l to 100 mM/l in terms of $Pb^{2+}$ and a combined concentration of zirconium and titanium ions ranging from 0.01 mM/l to 100 mM/l in terms of $Ti^{4+}$ and $Zr^{4+}$, respectively.

15. The process according to claim 3 wherein the thin film of lead titanate deposited on the substrate by hydrolysis of said complex alkoxide is thermally treated at a temperature ranging from 400 to 750° C.

16. The process according to claim 4 wherein the thin film of lead titanate deposited on the substrate by hydrolysis of said complex alkoxide is thermally treated at a temperature ranging from 400 to 900° C.

17. The process according to claim 14, wherein the lead carboxylate is a salt of a carboxylic acid having less than or equal to 10 carbon atoms, said titanium alkoxide is an alkoxide having less than or equal to 15 carbon atoms and wherein said liquid phase reaction is carried out in a solvent of ethylene glycol monoalkyl or monoaryl ether.

18. The process according to claim 17, wherein the carboxylic acid has less than or equal to 6 carbon atoms, the alkoxyl group of the titanium alkoxide has less than or equal to 8 carbon atoms, and wherein the thin film of lead titanate deposited on the substrate by hydrolysis of said complex alkoxide is thermally treated at a temperature ranging from 400–900° C. to produce a perovskite structure.

* * * * *